United States Patent
Chang

(10) Patent No.: US 7,565,600 B2
(45) Date of Patent: Jul. 21, 2009

(54) METHOD FOR DETERMINING OUTPUT SIGNALS OF A VITERBI DECODER

(75) Inventor: Chia-Yen Chang, Taipei (TW)

(73) Assignee: Lite-On It Corporation, Hsinchu (TW)

( * ) Notice: Subject to any disclaimer, the term of this patent is extended or adjusted under 35 U.S.C. 154(b) by 386 days.

(21) Appl. No.: 11/160,874

(22) Filed: Jul. 13, 2005

(65) Prior Publication Data
US 2006/0015800 A1   Jan. 19, 2006

(30) Foreign Application Priority Data
Jul. 14, 2004   (TW)   ............................... 93121043 A

(51) Int. Cl.
*H03M 13/00*   (2006.01)
(52) U.S. Cl. .................. 714/795; 714/799; 714/769
(58) Field of Classification Search .................. 714/795, 714/791, 794, 799, 803, 769, 770
See application file for complete search history.

(56) References Cited

U.S. PATENT DOCUMENTS

| 4,763,328 A | * | 8/1988 | Shimoda et al. | .............. 714/703 |
| 5,881,075 A | * | 3/1999 | Kong et al. | .................. 714/795 |
| 6,603,722 B1 | * | 8/2003 | Taguchi et al. | ........... 369/59.21 |
| 6,654,929 B1 | * | 11/2003 | Kamada | ..................... 714/795 |

FOREIGN PATENT DOCUMENTS

JP   H09-326708   12/1997

* cited by examiner

*Primary Examiner*—Scott T Baderman
*Assistant Examiner*—Fritz Alphonse
(74) *Attorney, Agent, or Firm*—Winston Hsu

(57) ABSTRACT

The present invention provides a method for determining output signals of a Viterbi decoder. Firstly, in step (a), a plurality of digital signals are received through a path memory module of the Viterbi decoder with decoding an input signal; in step (b) the received digital signals in step (a) are compared with a default number; and in step (c), an output according to the comparison result provided by step (b) is determined.

9 Claims, 5 Drawing Sheets

| O9~O0 | Situation |
|---|---|
| 0000000001 | For I0=min{I9, I8, I7, I6, I5, I4, I3, I2, I1, I0} |
| 0000000010 | For I1=min{I9, I8, I7, I6, I5, I4, I3, I2, I1, I0} |
| 0000000100 | For I2=min{I9, I8, I7, I6, I5, I4, I3, I2, I1, I0} |
| 0000001000 | For I3=min{I9, I8, I7, I6, I5, I4, I3, I2, I1, I0} |
| 0000010000 | For I4=min{I9, I8, I7, I6, I5, I4, I3, I2, I1, I0} |
| 0000100000 | For I5=min{I9, I8, I7, I6, I5, I4, I3, I2, I1, I0} |
| 0001000000 | For I6=min{I9, I8, I7, I6, I5, I4, I3, I2, I1, I0} |
| 0010000000 | For I7=min{I9, I8, I7, I6, I5, I4, I3, I2, I1, I0} |
| 0100000000 | For I8=min{I9, I8, I7, I6, I5, I4, I3, I2, I1, I0} |
| 1000000000 | For I9=min{I9, I8, I7, I6, I5, I4, I3, I2, I1, I0} |

Fig. 3 Prior Art

METHOD FOR DETERMINING OUTPUT SIGNALS OF A VITERBI DECODER

BACKGROUND OF THE INVENTION

1. Field of the Invention

The present invention provides a method for determining output signals of a Viterbi decoder, and more particularly, a method for determining the output signals according to difference between the sum of digital signals provided by a path memory module and the half of state number.

2. Description of the Prior Art

Maximum likelihood sequence estimation, or MLSE, has been utilized in a plurality of digital decoders generally, where a Viterbi detector is one of those circuits detecting convolution codes based on MLSE. As those skilled in the art recognize, a communication channel always includes additive white Gaussian noise, (or AWGN), or other forms of interference, so that a communication system encodes data prior to transmission for decreasing detection errors after the data is received. For example, by application of a specific algorithm, a given amount of data is convoluted to include more data bits prior to transmission. Based on the algorithm, the communication system can detect whether the received data is correct or not, and even correct erroneous bits in the data.

Please refer to FIG. 1, which illustrates a block diagram of a prior art Viterbi decoder 10. The Viterbi decoder 10 includes a branch metric unit 12, an add-compare-select unit 14, a path memory module 18, a path metric memory module 16 and an output selector 20. The branch metric unit 12 receives a sequence of signals DTi, and transmits the signals DTi to the add-compare-select unit 14 through a plurality of branch paths according to a default setting of the Viterbi decoder 10. The add-compare-select unit 14 determines path metrics of the signals DTi by means of a Viterbi algorithm based on MLSE, and outputs the path metrics to the path metric memory module 16. Meanwhile, the add-compare-select unit 14 calculates a plurality of state values and outputs to the path memory module 18. The output selector 20 determines a sequence of output signals DTo according to signals outputted from the path memory module 18. Operations of the Viterbi decoder 10 are well known in the art, so no further details of such are disclosed herein. As to the output selector 20 of the Viterbi decoder 10, take partial response PR (1,2,2,2,1) for example. Please refer to FIG. 2, which illustrates a configuration diagram of the output selector 30 with state number 10. The output selector 30 includes a minimum selector 32 and an output module 33. The minimum selector 32 includes ten input terminals I0~I9 and ten output terminals O0~O9 for receiving digital signals provided by the path memory module 18 through the input terminals I0~I9, and outputting the signals from the output terminals O0~O9 to the output module 33, while the output module 33 includes ten AND gates 34 and three OR gates 36. Please refer to FIG. 3, which illustrates a table of output signals of the minimum selector 32. In FIG. 3, the second column of the table represents different situations of the minimum selector 32, and the first column represents output signals corresponding to the situations in the second column.

Therefore, with the output selector 30, the prior art ten-state-number Viterbi decoder can output reliable results. However, as shown in FIG. 2 and FIG. 3, the output selector 30 includes complicated circuits, which costs a lot in terms of system resources. Moreover, with more and more input signals, the output selector becomes more and more complicated, so production costs increase along with the abovementioned drawbacks.

SUMMARY OF THE INVENTION

It is therefore a primary objective of the claimed invention to provide a method for determining output signals of a Viterbi decoder.

According to the claimed invention, a method for determining output signals of a Viterbi decoder includes following steps: (a) receiving a plurality of digital signals through a path memory module of the Viterbi decoder after the Viterbi decoder decodes an input signal; (b) comparing the received digital signals in step (a) with a default number; and (c) determining an output signal according to the comparison result provided in step (b).

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 illustrates a table of output signals of a minimum selector in FIG. 2.

DETAILED DESCRIPTION

Figure 1:
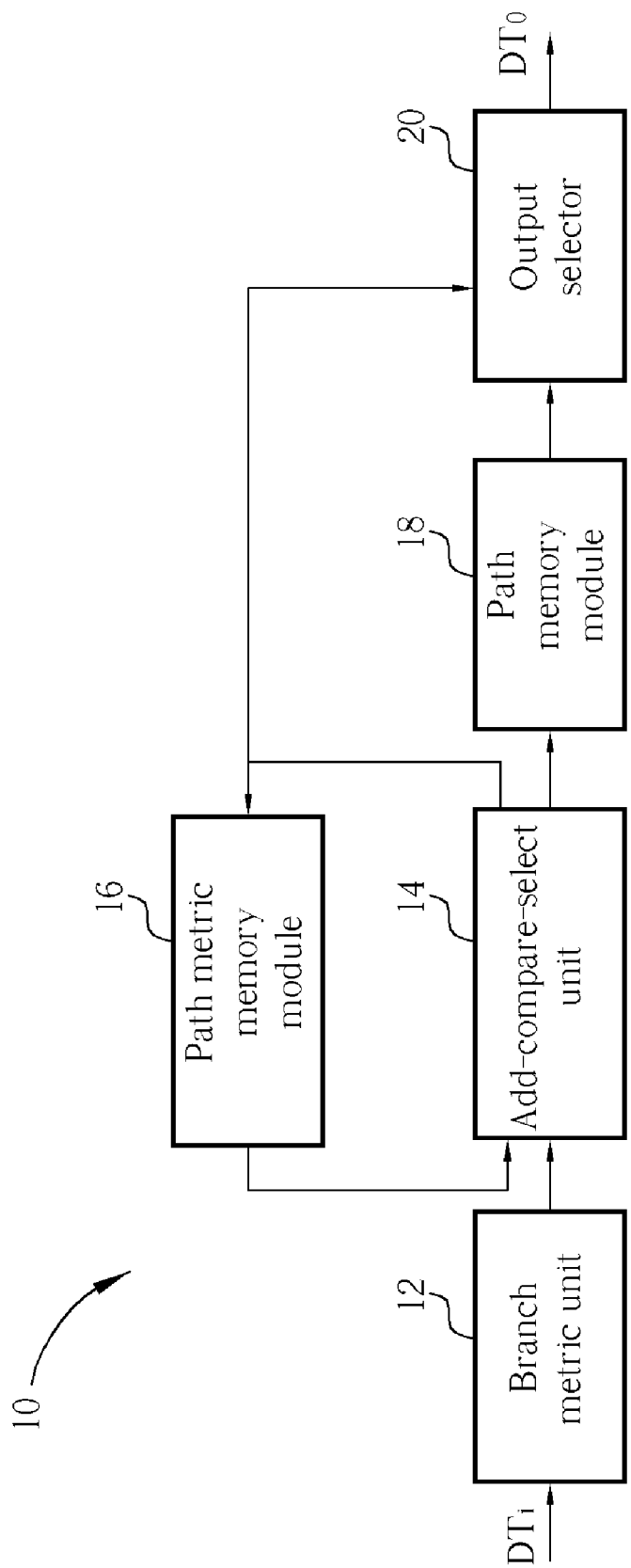
FIG. 1 illustrates a block diagram of a prior art Viterbi decoder.
Figure 2:
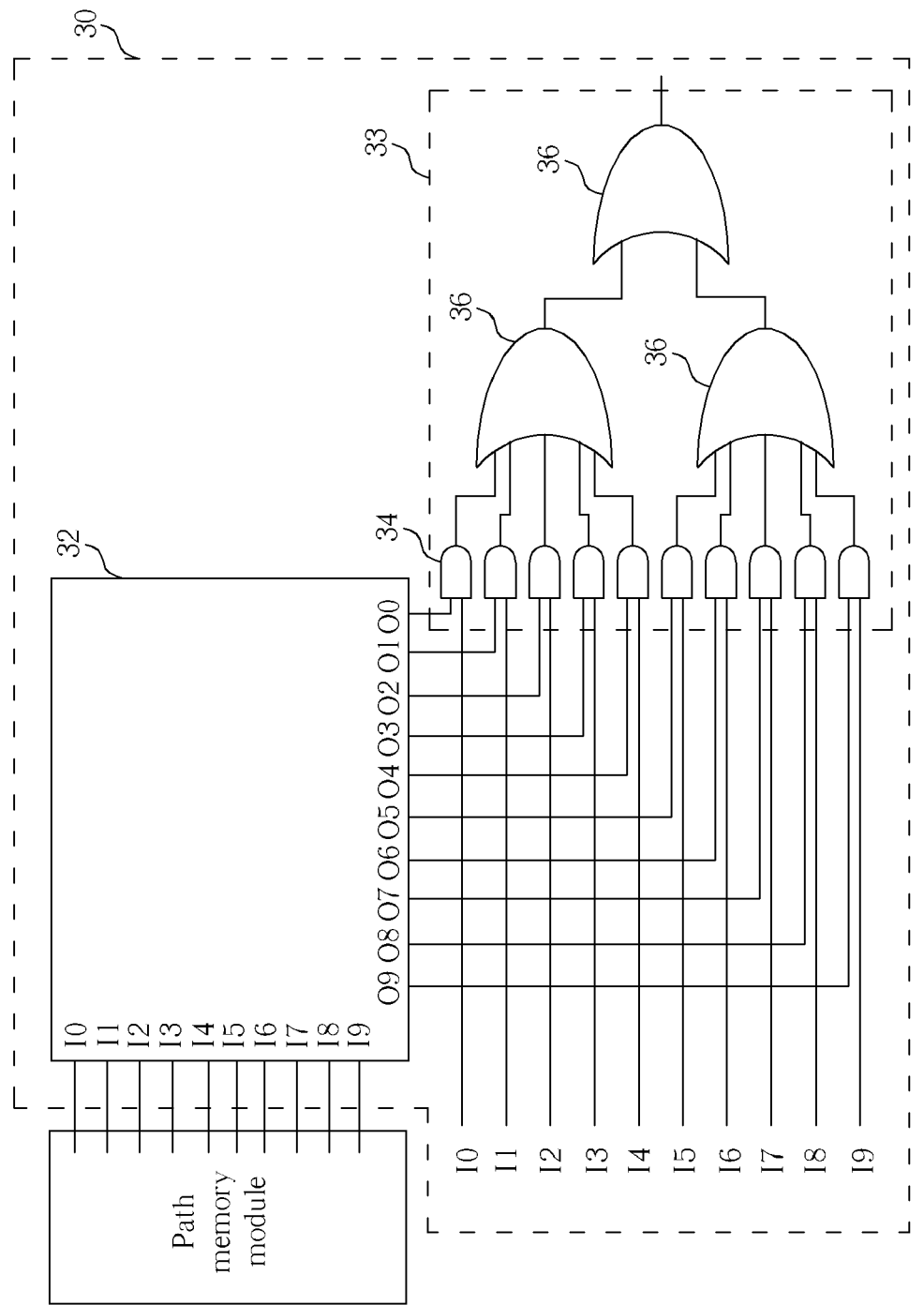
FIG. 2 illustrates a configuration diagram of a prior art Viterbi decoder having ten states.
Figure 4:
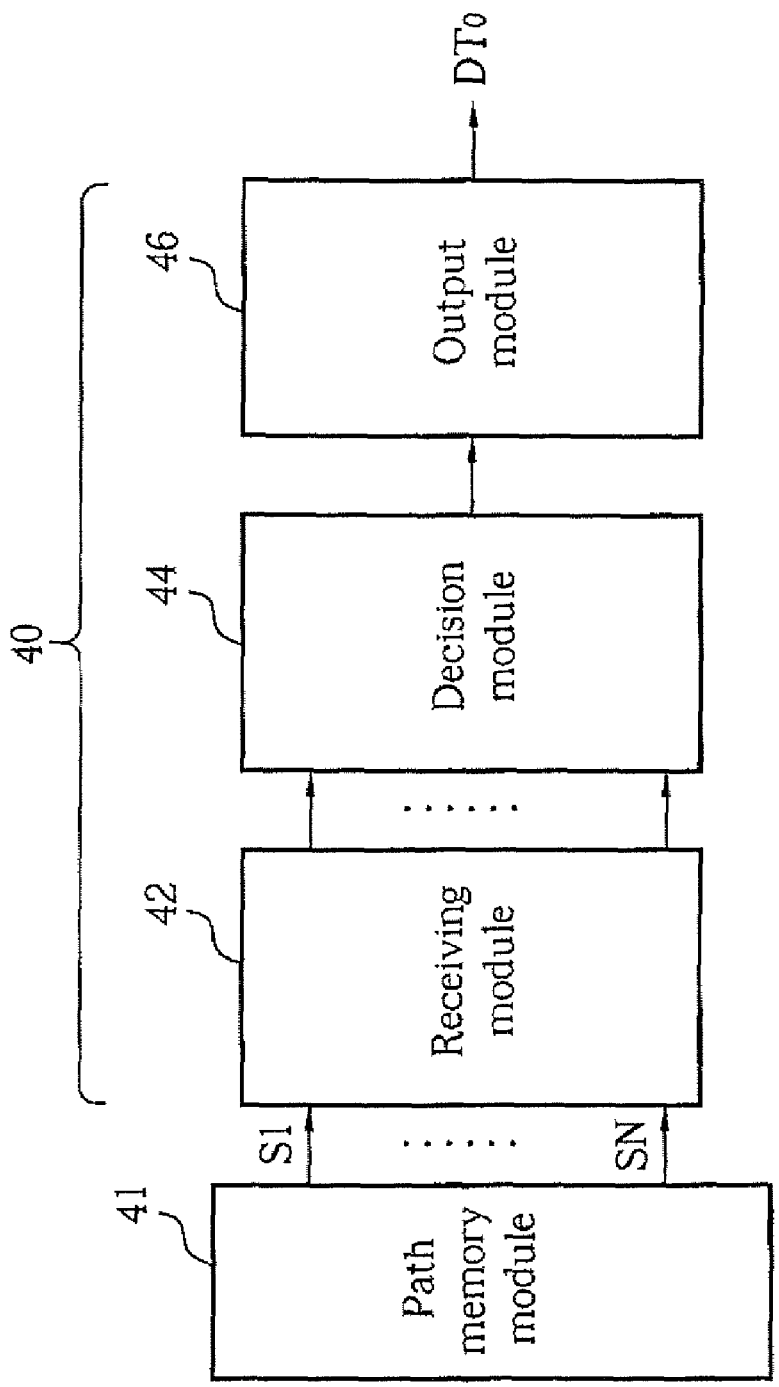
FIG. 4 illustrates a schematic diagram of a present invention output selector of a Viterbi decoder.
Figure 5:
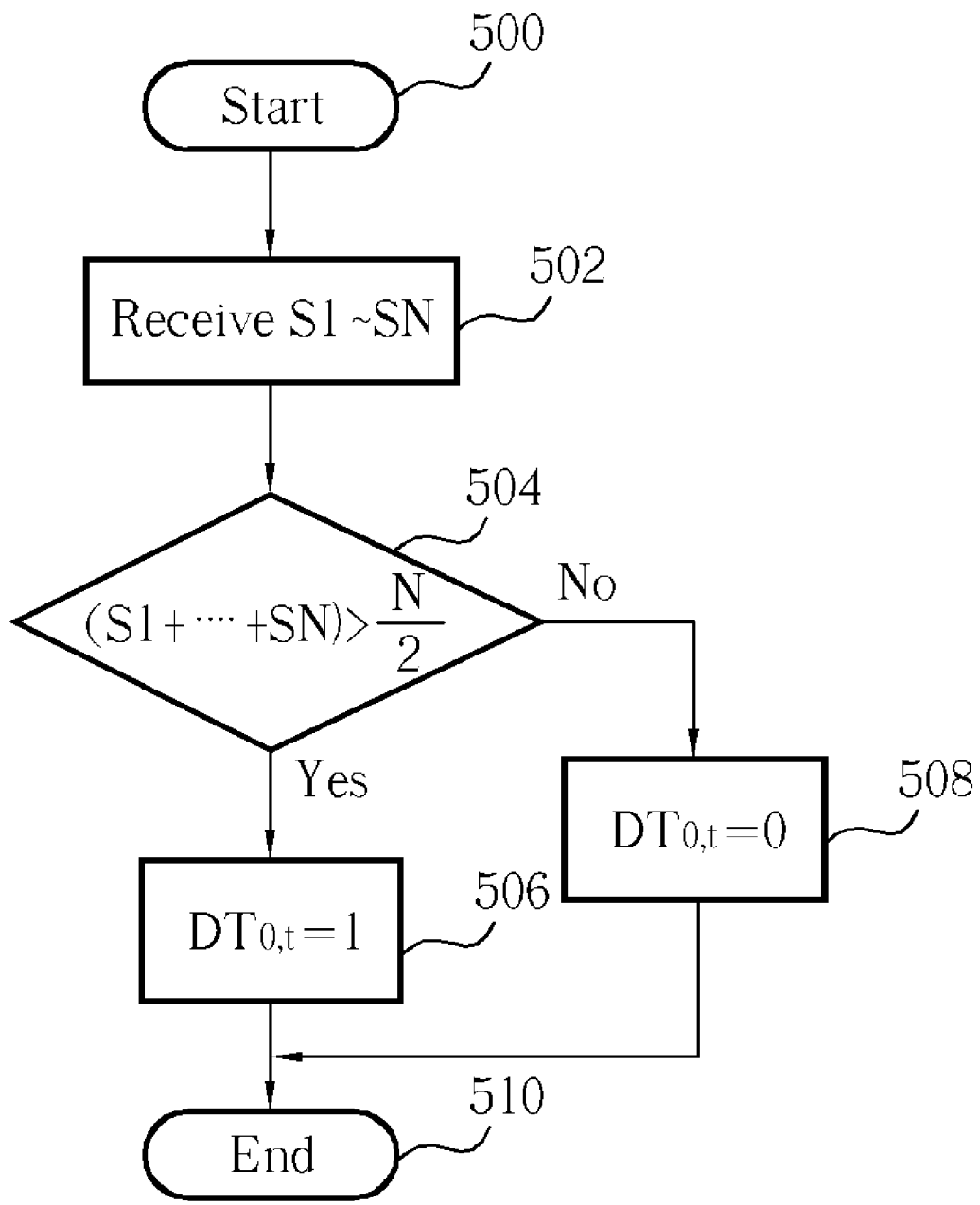
FIG. 5 illustrates a flowchart of a present invention decision process for determining output signals of a Viterbi decoder.

Please refer to FIG. 4, which illustrates a schematic diagram of an output selector 40 of a Viterbi decoder in accordance with the present invention. The output selector 40 includes a receiving module 42, a decision module 44 and an output module 46. The receiving module 42 receives N digital signals S1~SN from a path memory module 41 of the Viterbi decoder, where "N" means the state number of the Viterbi decoder. The output module 46 outputs binary signals DTo according to the decision module 44. As to operations of the decision module 44, please refer to FIG. 5, which illustrates a flowchart of a process 50 of the Viterbi decoder for determining output signal. The process 50 includes following steps:

Step 500: start.
Step 502: receiving digital signals S1~SN.
Step 504: comparing the sum of the digital signals S1~SN with the half of the state number N. If the sum of the digital signals S1~SN is greater than the half of the state number N, the process 50 proceeds to the next step, otherwise the process proceeds to step 508.
Step 506: outputting logic "1".
Step 508: outputting logic "0".
Step 510: end.

In short, the process 50 compares the sum of the digital signals S1~SN provided by the path memory module with the half of the state number N (or N/2) for determining output signals DTo. For example, a Viterbi decoder of a high-density digital-versatile-disc, or HD-DVD drive, includes ten states, so that as long as the Viterbi decoder compares the sum of ten digital signals S1~S10 with 5 (the half of the state number 10), the Viterbi decoder can output logic "1" when the sum of the digital signals S1~S10 is greater than 5, or logic "0" if the opposite is true.

When over half of the digital signals S1~S10 are logic "1", the sum of the digital signals S1~S10 is greater than 5 (or N/2). Therefore, most of the digital signals are logic "1", and we can determine that the output signal should be logic "1". Conversely, when over half of the digital signals S1~S10 are logic "0", the sum of the digital signals S1~S10 is smaller than 5 (or N/2), so we can determine that the output signal should be logic "0". The above decision method conforms to MLSE. In addition, when the sum of the digital signals S1~S10 equals 5, the output signal is logic "1" or "0" according to the system setting.

As mentioned above, half of the state number N/2 is one embodiment, and we can set the decision standard as being ((N/2)+1), so if the sum of the digital signals S1~S10 is greater than 6 (meaning that over six of the digital signals S1~S10 are logic "1"), the output signal is logic "1", or else, logic "0".

Based on the process 50, the decision module 44 determines the output signals and transmits the output signals to a system through the output module 46. Because the process 50 compares the sum of the digital signals provided by the path memory module with the half of the state number, the decision module 44 of the output selector 40 includes only an adder and a comparator, i.e. the basic requirement to determine the signals DTo for the system, which decreases system resources and the cost of production.

In comparison with the prior art, the present invention reduces circuit complexity, so as to decrease the cost of production. Furthermore, with longer length of input signals, the state number of the Viterbi decoder increases, causing more complex circuit of a prior art output selector, but the decision module of the present invention output selector only includes an adder and a comparator for determining output signals regardless of the length of the input signals. Therefore, the present invention improves the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for determining output signals by an output selector of a Viterbi decoder, wherein the Viterbi decoder further includes a add-compare-select unit and a path memory module, the add-compare-select unit used for determining path metrics by means of a Viterbi algorithm and outputting them to the path memory module, the method for determining output signals by the output selector comprising following steps:
   (a) receiving a plurality of digital signals through the path memory module of the Viterbi decoder;
   (b) comparing the received digital signal in step (a) with a default number; and
   (c) determining an output signal according to the comparison result provided in step (b).

2. The method of claim 1, wherein step (b) comprises comparing a sum of the received digital signal in step (a) with a default number.

3. The method of claim 2, wherein step (c) comprises determining that the output signal is logic 1 when the comparison result provided in step (b) represents a comparison in which the sum of the received digital signal in step (a) is found to be greater than the default number.

4. An output selector of a Viterbi decoder, wherein the Viterbi decoder further includes a add-compare-select unit and a path memory module, the add-compare-select unit used for determining path metrics by means of a Viterbi algorithm and outputting them to the path memory module, the output selector comprising:
   a receiving module for receiving a plurality of digital signals from the path memory module of the Viterbi decoder;
   a decision module for comparing the received digital signals of the receiving module with a default number; and
   an output module for outputting an output signal according to the comparison result provided by the decision module.

5. The output selector of claim 4, wherein the decision module compares a sum of the received digital signals of the receiving module with a default number.

6. The output selector of claim 5, wherein when the comparison result provided by the decision module represents a comparison in which the sum of the received digital signal of the receiving module is greater than the default number, the output module determined that the output signal is logic 1.

7. A method for determining output signals by an output selector of a Viterbi decoder, wherein the Viterbi decoder further includes a add-compare-select unit and a path memory module, the add-compare-select unit used for determining path metrics by means of a Viterbi algorithm and outputting them to the path memory module, the method for determining output signals by the output selector comprising following steps:
   (a) receiving a plurality of digital signals through the path memory module of the Viterbi decoder;
   (b) comparing a sum of the received digital signals in step (a) with a default number; and
   (c) determining an output signal according to the comparison result provided in step (b).

8. The method of claim 7, wherein the default number equals 10 in HD-DVD.

9. The method of claim 7, wherein the output signal is logic 1 if the sum of the received digital signal is pester than the default number.

* * * * *